(12) United States Patent
Rotsch

(10) Patent No.: US 6,552,331 B2
(45) Date of Patent: Apr. 22, 2003

(54) DEVICE AND METHOD FOR COMBINING SCANNING AND IMAGING METHODS IN CHECKING PHOTOMASKS

(75) Inventor: Christian Rotsch, München (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 09/923,703

(22) Filed: Aug. 6, 2001

(65) Prior Publication Data

US 2002/0017621 A1 Feb. 14, 2002

(30) Foreign Application Priority Data

Aug. 4, 2000 (DE) .......................................... 100 39 337

(51) Int. Cl.⁷ .................................................. H01J 3/14
(52) U.S. Cl. .................... 250/234; 250/306; 356/237.4; 382/144
(58) Field of Search ................................ 250/234, 216, 250/306, 307, 309, 310, 311; 356/237.4, 237.5, 239.3, 398, 492, 496; 382/144, 145; 73/105, 1.89

(56) References Cited

U.S. PATENT DOCUMENTS

| | | | |
|---|---|---|---|
| 5,563,702 A | * | 10/1996 | Emery et al. .................. 356/73 |
| 6,000,281 A | * | 12/1999 | Burke .......................... 73/105 |
| 6,084,673 A | * | 7/2000 | Van Den Brink et al. .. 356/492 |
| 6,196,061 B1 | * | 3/2001 | Adderton et al. ............. 73/105 |
| 6,250,143 B1 | * | 6/2001 | Bindell et al. ................ 73/105 |

FOREIGN PATENT DOCUMENTS

| | | |
|---|---|---|
| DE | 195 09 903 A1 | 9/1996 |
| DE | 195 31 466 A1 | 10/1996 |
| DE | 195 31 068 A1 | 2/1997 |
| DE | 197 14 346 A1 | 10/1998 |
| EP | 0 244 816 A2 | 11/1987 |
| EP | 0 532 927 B1 | 3/1993 |
| EP | 0 722 574 B1 | 7/1996 |

* cited by examiner

*Primary Examiner*—Kevin Pyo
*Assistant Examiner*—Seung C. Sohn
(74) *Attorney, Agent, or Firm*—Laurence A. Greenberg; Werner H. Stemer; Ralph E. Locher (57) ABSTRACT

An apparatus and method for imaging and scanning masks for semiconductor production includes placing a scanning instrument having a probe at a position to scan a layer side of a mask with the probe, placing an optical microscope on a side of the mask opposite the layer side at a position to image a detail of the mask from the side of the mask opposite the layer side, positioning the scanning instrument and the optical microscope relative to each other such that the optical microscope images the probe and the mask simultaneously, and laterally displacing the mask between and relative to the scanning instrument and the optical microscope to permit selection of an imaged detail of the mask while a relative position between the scanning instrument and the optical microscope is maintained. A selected detail of the mask is imaged and/or scanned.

27 Claims, 4 Drawing Sheets

DEVICE AND METHOD FOR COMBINING SCANNING AND IMAGING METHODS IN CHECKING PHOTOMASKS

BACKGROUND OF THE INVENTION

Field of the Invention

The invention lies in the field of semiconductors. The invention relates to an apparatus and a method for imaging and scanning masks for semiconductor production.

Such photomasks are needed for the exposure steps in semiconductor production. In order, for example, to be able to implement structure sizes of 180 nm in a CMOS process, photomasks with structure sizes of about 700 nm (that is to say about four times the structure size to be produced) are needed. The exposure of the semiconductor substrate coated with photosensitive lacquer is then carried out through such photomasks. Typically, etching and evaporation steps then follow the exposure step.

For the purpose of quality control in the production of such photomasks, because of the typical structure size of 700 nm, optical microscopy is the clear choice. A photomask includes a glass substrate, onto which the desired structure is applied by evaporating molybdenum silicide (MoSi) or chromium. The transparent and opaque areas of the photomask can be represented with good contrast by using optical microscopy methods.

In addition to optical microscopy, scanning methods such as scanning probe microscopy are gaining significance in the analysis of photomasks. In the case of such methods, a probe scans the height profile of the mask surface. Piezoceramic actuators permit the highly accurate positioning of the probe relative to the mask surface so that the height relief on the layer side of the mask can be registered with high resolution. In the use of scanning probe microscopy, a problem arises relating to placing the scanning probe at the correct point on the mask surface at the start of the scanning operation. In the case of manually position of the probe on the mask, it is often not clear which area of the surface is currently being scanned. Therefore, it would be helpful to be able to position the probe with a view of the mask.

Prior art includes equipping a scanning probe microscope or a surface profilometer with imaging optics and a miniature camera for enabling a track of the position of the probe on the mask surface. The drawback with such a solution is, first, the small field of view of the camera. Second, in such an embodiment of the scanning probe microscope or the surface profilometer, a significant number of functions have to be integrated in an extremely small space, which makes the handling of the scanning instrument more difficult. It is difficult to carry out adjustment work and to replace damaged scanning probes.

SUMMARY OF THE INVENTION

It is accordingly an object of the invention to provide a device and method for combining scanning and imaging methods in checking photomasks that overcomes the hereinafore-mentioned disadvantages of the heretofore-known devices and methods of this general type and that makes the scanning and imaging of defined areas of the mask surface easier.

With the foregoing and other objects in view, there is provided, in accordance with the invention, an apparatus for imaging and scanning masks for semiconductor production, the masks having a layer side and an opposing side, the apparatus including a scanning instrument having a probe, the probe disposed to scan a layer side of a mask, an optical microscope for imaging a detail of the mask from a side of the mask opposing the layer side, the optical microscope disposed opposite the scanning instrument with respect to the mask, a positioning device positioning the scanning instrument and the optical microscope relative to one another such that the optical microscope images the probe and the mask simultaneously, and a displacing device connected to the mask and laterally displacing the mask between and relative to the scanning instrument and the optical microscope to permit selection, of an imaged detail of the mask while a relative position between the scanning instrument and the optical microscope is maintained.

In the case of the apparatus according to the invention, the scanning of the mask is carried out from the layer side, while the optical microscope images the mask structures from the side of the mask facing away from the layer side. By using such an inverted microscope, the upper side of the mask can be scanned while the optical imaging is being carried out from the underside of the mask at the same time. As such, the scanning instrument and the optical microscope are prevented from hampering each other. The two instruments can be positioned freely relative to the mask and relative to the respective other instrument.

In addition, the apparatus according to the invention has a positioning device or means for positioning the scanning instrument and the opposing optical microscope, with which the two instruments can be positioned relative to each other such that the probe of the scanning instrument can be imaged by the optical microscope at the same time. As soon as the probe of the scanning instrument can be detected in the microscope image, the two instruments are in mutually opposite positions, which are connected by an axis running at right angles to the mask surface (so-called "on-axis" position). In such a position, the scanning instrument is fixed relative to the optical microscope.

In the solution according to the invention, the probe is positioned on the mask by lateral displacement of the mask relative to the two instruments fixed in the relation to each other. For such a purpose, the apparatus according to the invention includes a displacing device or means for the lateral displacement of the mask. With the displacing device, the imaged detail of the mask can be selected while maintaining the relative position between the scanning instrument and the opposing optical microscope. Because the relative position between the scanning instrument and the opposing microscope has been fixed once for all in the "on-axis" position, the position of the probe in the field of the view of the optical microscope remains unchanged. The probe is, therefore, continuously visible in the image supplied by the optical microscope, even when the position of the mask surface is changed relative to the probe.

As soon as the two instruments have been fixed once in the "on-axis" position in relation to each other, various areas of the photomask can be moved to and examined. Thus, the time-consuming and tiresome search for the probe in the field of view of the optical microscope is eliminated. Such elimination makes possible rapid and precise positioning of the probe on the mask surface. Various critical production structures on the photomask can be moved to one after another and then respectively be imaged and scanned.

With the objects of the invention in view, there is also provided a method of imaging and scanning masks for semiconductor production including the steps of placing a scanning instrument having a probe at a position to scan a layer side of a mask with the probe, placing an optical microscope on a side of the mask opposite the layer side at a position to image a detail of the mask from the side of the mask opposite the layer side, positioning the scanning instrument and the optical microscope relative to each other such that the optical microscope images the probe and the mask at the same time, laterally displacing the mask while maintaining a relative position between the scanning instrument and the optical microscope, and at least one of imaging and scanning a selected detail of the mask.

The method according to the invention for imaging and scanning masks for semiconductor production includes three steps. In a first step, the scanning instrument and the optical microscope are positioned relative to each other. The positioning is carried out such that the probe of the scanning instrument can be imaged by the optical microscope at the same time. The position of the probe of the scanning instrument can, therefore, be detected from the image of the mask supplied by the optical microscope. Such image shows that the scanning instrument and the opposing optical microscope are located in the "on-axis" position. Then, in a second step, the mask is displaced laterally, the relative position between the scanning instrument and the opposing optical microscope being maintained. Therefore, the probe of the scanning instrument can be positioned as desired relative to the photomask. In the process, the probe always remains detectable in the image supplied by the optical microscope. When the desired detail of the mask has been found, the selected mask area is imaged and/or scanned in a third step.

The advantage of the method according to the invention is that the tiresome and time-consuming search for the probe of the scanning instrument only has to be carried out just once for each mask examined.

In accordance with another feature of the invention, the displacing device for laterally displacing the mask includes a displaceably mounted mask table. The photomask is fixed on the mask table and then can be moved in two coordinate directions at right angles to the axis that is defined by the scanning instrument and the optical microscope. With such a probe table, the photomask can be positioned precisely relative to the two instruments.

In accordance with a further feature of the invention, it is advantageous if the mask table can be positioned by stepping motors. The motors make it possible to control the displacement of the probe table automatically. As such, it is possible to move exactly to predefined points on the mask surface. Stepping motors permit accurate position to fractions of micrometers.

In accordance with an added feature of the invention, the positioning device for positioning the scanning instrument and the opposing optical microscope relative to each other are implemented by displaceable mounting of the scanning instrument and/or the optical instrument. Displaceable mounting permits the probe of the scanning instrument to be found rapidly with the optical microscope.

In accordance with an additional feature of the invention, it is advantageous if the scanning instrument is a scanning probe microscope. Scanning probe microscopy permits the mask surface to be scanned with a high lateral resolution and is, therefore, suitable, in particular, for checking mask structures.

In accordance with yet another feature of the invention, the scanning probe microscope can be a scanning force microscope.

In the scan mode, as it is known, the scanning tip of the scanning force microscope is lowered in the direction of the mask surface. As soon as the tip has reached the mask surface, the cantilever begins to bend. From the points at which bending begins, an exact height profile of the photomask can be calculated.

Up In accordance with yet a further feature of the invention, the scanning instrument is a scanning electron microscope. In scanning electron microscopy, the surface of the mask is bombarded with electrons. The back-scattered secondary electrons are registered by a detector that can be moved piezomechanically. Information about the vapor-deposited mask structures can be derived from these secondary electrons. In particular, the position of the edges of the individual mask structures can be registered well by a scanning electron microscope.

In accordance with yet an added feature of the invention, the scanning instrument is a surface profilometer. Such a profilometer scans the mask surface with a small glass tube of about 200 nm diameter. From the points at which the small glass tube encounters the mask surface, the surface profile of the mask can be determined. The geometry of the small glass tube is advantageously matched to the mask structure to be scanned (700 nm "main feature size").

In accordance with yet an additional feature of the invention, the illumination of the mask needed for the optical imaging is provided from the side facing away from the layer side. The light source is, therefore, disposed on the side of the optical microscope opposite the scanning instrument. The light that is incident from the microscope side passes through the glass substrate of the mask to the vapor-deposited surface structures, which reflect the incident light back to the optical microscope. In the microscope, the vapor-deposited structures, therefore, appear as areas of high light intensity. Conversely, the transparent areas of the mask appear dark because the illuminating light can pass through the glass substrate without hindrance at these points and is not reflected back to the optical microscope. Illuminating the mask using incident light geometry has the advantage that the light source is disposed on the side opposite the scanning instrument and, therefore, does not interfere in the operation of the scanning instrument. A further advantage of such an illuminating configuration is that the light source illuminates the probe through the transparent areas. Therefore, the brightly illuminated probe can be detected well by contrast with the dark background.

In accordance with again another feature of the invention, the illumination of the mask needed for the optical imaging is provided from the layer side of the mask. In the embodiment, the light source is disposed on the side of the scanning instrument. In the microscope image, the vapor-deposited structures of the mask appear as dark areas. By contrast, the transparent areas of the photomask appear light because the illuminating light can pass unimpeded to the optical microscope. Therefore, the advantage of illumination by transmitted light geometry is that the opaque areas actually appear as dark areas.

In accordance with again a further feature of the invention, illuminating the mask by transmitted light geometry is advantageous, in particular, when the illumination beam path includes at least one mirror. The mirror is disposed opposite the optical microscope and reflects the light incident from the light source in the direction of the optical microscope. In such a case, the light source can be fitted at some distance from the instruments. Such fitting prevents the light source from interfering in the operation of the scanning instrument.

In accordance with again an added feature of the invention, the optical microscope has a "long working distance" (LWD) objective. Such objectives have a large distance between the objective and focal plane. Using such an objective, the layer side of the mask and the probe of the scanning instrument can be imaged sharply through the glass substrate, even though the glass substrate is 2.5 mm to 6.3 mm thick.

In accordance with again an additional feature of the invention, the optical microscope is a phase microscope, and the mask used is a phase mask. Instead of transparent and opaque areas, a phase mask has areas with a different optical path length. In such a case, all the areas of one (chromium-free) phase mask are transparent. With phase contrast microscopy, however, phase differences of the light can be converted into brightness differences, and, as such, the areas of different optical path length can be made visible as areas of different brightness.

In accordance with still another feature of the invention, the optical microscope is connected to a camera, which supplies data to an image processing unit. The configuration makes possible automation of the quality control of photomasks. The evaluation of the optical microscope image no longer has to be carried out by a human and can be carried out by an image processing unit. Such a configuration permits automated quality assurance in semiconductor production.

In accordance with still a further feature of the invention, a comparison between the imaged detail of the mask and stored mask data is carried out in the image process unit. As a first result, statement relating to the quality of the photomask examined can be made. Furthermore, it is possible, by using the imaged mask structures and the stored mask data, to determine the position of the imaged detail relative to the entire mask. Thus, it is possible to determine at which point on the mask the two instruments are currently located. Even during dynamic changes in the lateral position of the mask relative to the two instruments, it is possible to specify the current observation position at any time.

In accordance with still an added feature of the invention, the image processing unit generates control signals for positioning the mask, which control the displacing device that laterally displaces the mask. The current position on the mask can be obtained from the analysis of the microscope image. If the position does not agree with the desired position, the image processing unit generates suitable control signals to drive the mask table. The mask table is repositioned until the predefined target position has been reached. As a result, it is possible to move to predefined mask areas completely automatically, and scanned and imaged. Such a configuration permits completely automated mask inspection.

In accordance with a concomitant feature of the invention, the displacing device that laterally displaces the mask is controlled such that various control structures and/or critical production mask structures located on the mask can be checked one after another. For example, a sequence of particularly critical areas can be defined that are to be moved to one after another and checked. Furthermore, at specific points on the mask, complicated control structures can be applied, with their checking permitting a statement about the quality of the mask.

Other features that are considered as characteristic for the invention are set forth in the appended claims.

Although the invention is illustrated and described herein as embodied in a device and method for combining scanning and imaging methods in checking photomasks, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case.

Figure 1:
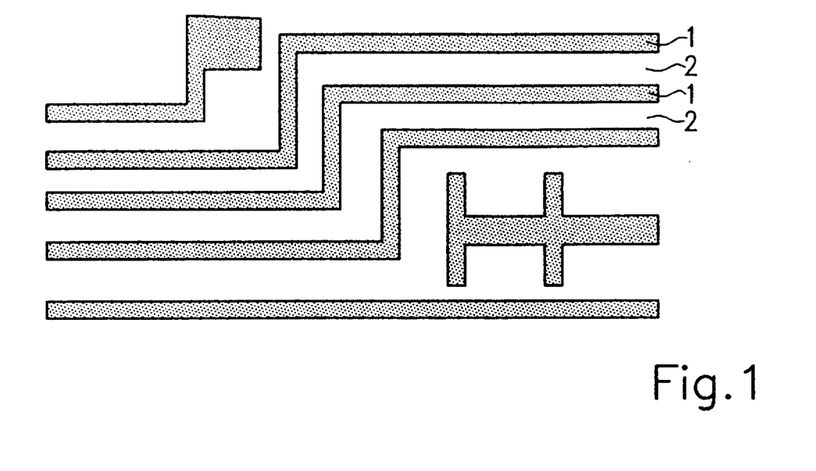
FIG. 1 is a diagrammatic, plan view of a photomask.

Referring now to the figures of the drawings in detail and first, particularly to FIG. 1 thereof, there is shown a detail of a photomask in plan view. In the opaque areas 1, the glass substrate is provided with a vapor-deposited material layer but, on the other hand, not in the transparent areas 2.

Figure 2A:
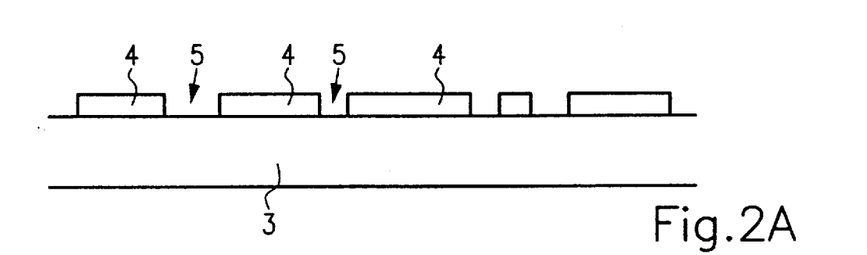
FIG. 2A is a fragmentary, cross-sectional view of a chromium or MoSi mask.
Figure 2B:
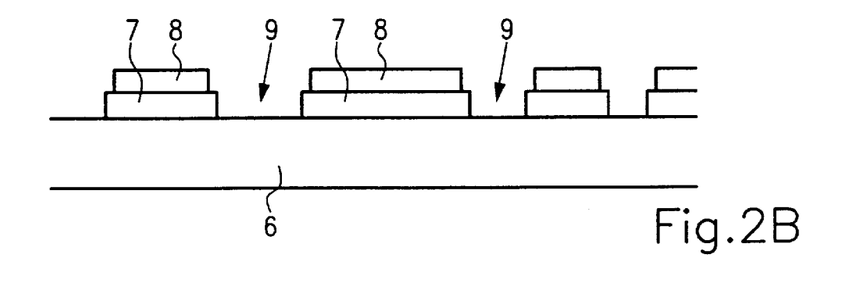
FIG. 2B is a fragmentary, cross-sectional view of a tritone mask.
Figure 2C:
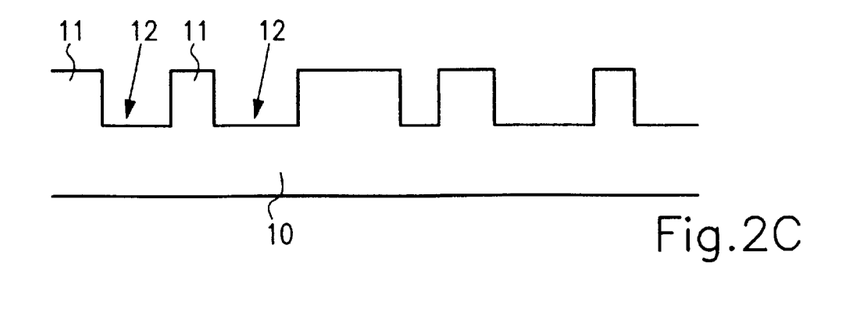
FIG. 2C is a fragmentary, cross-sectional view of a chromiumfree phase mask.

FIGS. 2A to 2C illustrate various types of photomasks in longitudinal section. In FIG. 2A, a glass substrate 3 has been coated with vapor-deposited structures 4. The thickness of the glass substrate 3 is between 2.5 mm and 6.3 mm; the thickness of the vapor-deposited structures 4 is typically 100 nm. Suitable vapor-deposition materials are chromium (Cr) and molybdenum silicide (MoSi). The vapor-deposited structures 4 are largely opaque, while the areas 5 with no vapor deposit structures 4 are transparent. The typical structure size (main feature size) of the masks currently used in semiconductor production is about 700 nm. Masks with MoSi vapor deposits are also referred to as "half tone" masks because a MoSi vapor deposit has a somewhat higher transmission than a Cr vapor deposit.

FIG. 2B illustrates a longitudinal section through a tritone mask. The tritone mask includes a glass substrate 6, to which a structured MoSi vapor-deposited layer 7 of about 100 nm thickness has been applied. On the areas occupied by MoSi, a Cr vapor-deposited layer 8 likewise about 100 nm thick has additionally been applied, so that the MoSi vapor-deposited layer 7 projects somewhat beyond the Cr vapor-deposited layer 8. In these edge areas, the tritone mask is slightly transparent, while it is completely opaque in the areas covered by the Cr vapor-deposited layer 8. The areas 9 with no vapor deposit are transparent.

FIG. 2C illustrates a (chromium-free) phase mask 10 in longitudinal section, which has a structure of areas of high optical path length 11 and areas of low optical path length 12. Selective etching of a glass substrate produces such a phase mask, typical etching depths being 240 nm to 700 nm. The "main feature size" of a phase mask is likewise about 700 nm.

While the mask structures illustrated in FIGS. 2A and 2B can be made visible with conventional microscopy methods, the structures of the phase mask illustrated in FIG. 2C can be detected only with microscopy methods that convert phase differences into brightness differences (e.g., phase contrast microscopy, Schlieren methods, etc.).

In addition to imaging microscopy methods, scanning methods are also used for the quality control of photomasks. One example of such a technique is scanning force microscopy, whose functional principle will be explained using FIG. 3. Fitted to the measuring head 13 is a cantilever 14 that can be deflected in the z direction and that, at its front end, has a sensing tip 15. By using the piezoceramic actuating element 16, the measuring head 13 can be positioned both laterally (that is to say in the x and y directions) and in the z direction. Using piezoceramic actuating elements, a positioning accuracy in the nanometer range can be realized. The deflection of the cantilever 14 is detected with the aid of a light pointer. To such an end, the laser diode 17 generates a laser beam 18, which is reflected from the upper side of the cantilever 14 in the direction of the multisegment photodiode 19. The deflection of the cantilever 14 can be determined from the photovoltages that are present on the individual segments of the multisegment photodiode 19.

Figure 3:
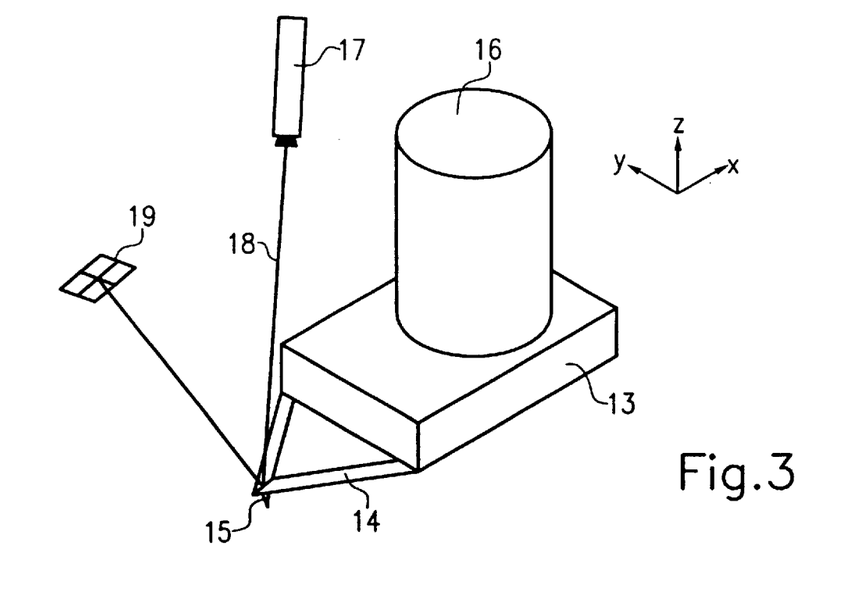
FIG. 3 is a diagrammatic, perspective view of a scanning force microscope.

To scan the height profile of a photomask, the scanning force microscope is operated in the scan mode. First, a specific x-y position of the measuring head 13 is predefined by the piezoceramic actuating element 16. There then follows a constant advance of the measuring head 13 in the direction of the photomask (that is, in the z direction). The advance is produced by applying a voltage ramp to the piezoceramic actuating element 16. As soon as the scanning tip 15 encounters the mask surface, the cantilever 14 begins to bend, and the deflection can be registered by the multi-segment photodiode 19. At a time at which the cantilever deflection begins, the z position of the piezoceramic actuating element 16 is stored. Such z values are registered for various x-y positions of the measuring head 13. These z values reproduce the height profile of the photomask directly.

Figure 4:
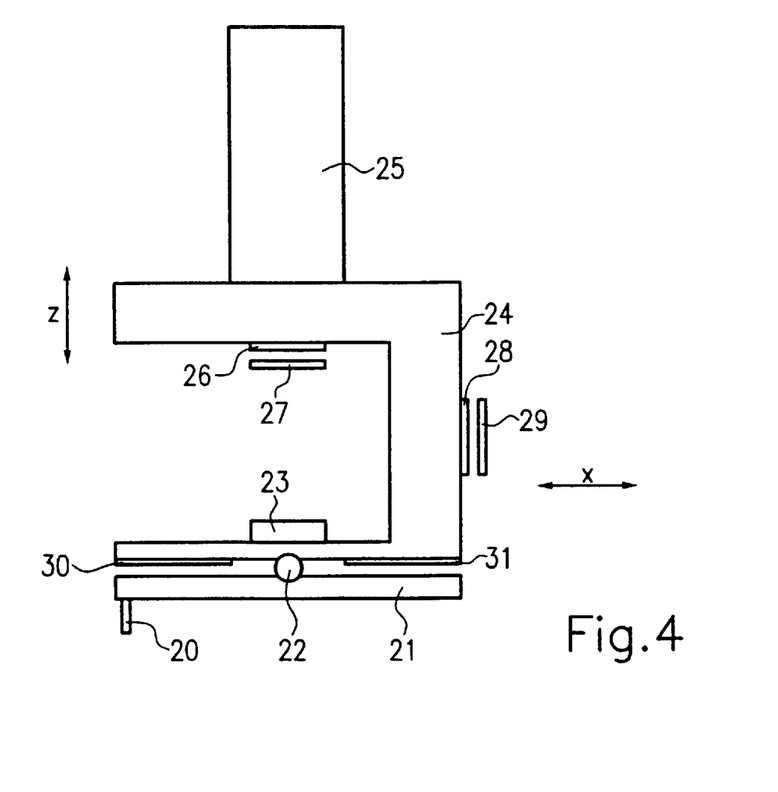
FIG. 4 is a diagrammatic, cross-sectional view of a surface profilometer.

FIG. 4 illustrates the basic construction of a surface profilometer. Such instruments are used for the surface analysis both of semiconductor structures and of photomasks. Scanning is carried out by the scanning probe 20, the scanning probe used typically being a small glass tube of about 200 nm diameter. The scanning probe 20 is fixed to a scanning rocker 21 that, in turn, is connected to the steel ball 22. Both the steel ball 22 and the rocker 21 connected to it are fixed on the measuring head 24 in an articulated manner by the magnetic force of the magnet 23. The measuring head 24, the rocker 21 connected thereto, and the scanning probe 20 can be positioned as desired in the x, y, and z directions by the piezoceramic actuating element 25. In such a case, capacitive measurement sensors register the current position of the measuring head 24. For such a purpose, a first capacitor plate 26 is firmly connected to the measuring head 24 and forms a capacitor with the capacitor plate 27, which is suspended in a fixed position. When the z position of the measuring head 24 changes, the distance between the two capacitor plates 26 and 27 also changes. By measuring the capacitance between the plates 26 and 27, it is, therefore, possible to register the z position of the measuring head 24. In a corresponding way, the measurement sensor for the x position includes a capacitor plate 28 connected to the measuring head 24 and a capacitor plate 29 in a fixed position.

To record the surface profile of a sample, the measuring head 24 is moved toward the sample in the z direction. As soon as the scanning probe 20 encounters the sample surface, the scanning rocker 21 is deflected. To be able to detect the deflection, two capacitor plates 30 and 31 are fitted to the measuring head 24 and, in each case together with the scanning rocker 21, form a capacitor. When the scanning rocker 21 is deflected, then the distance between the plate 30 and rocker 21 decreases, while the distance between the plate 31 and the rocker 21 increases. By measuring the capacitance for the difference between these capacitances, the point at which the scanning probe 20 encounters the sample is registered. The z position associated with the time of the encounter is stored. The measuring head is then moved away from the sample in the z direction and repositioned laterally. The measuring head is then moved toward the sample again in the z direction to determine the z position of the point of encounter at the location. By such "sewing-machine-like" scanning of the sample surface, the surface profile can be recorded.

Figure 5:
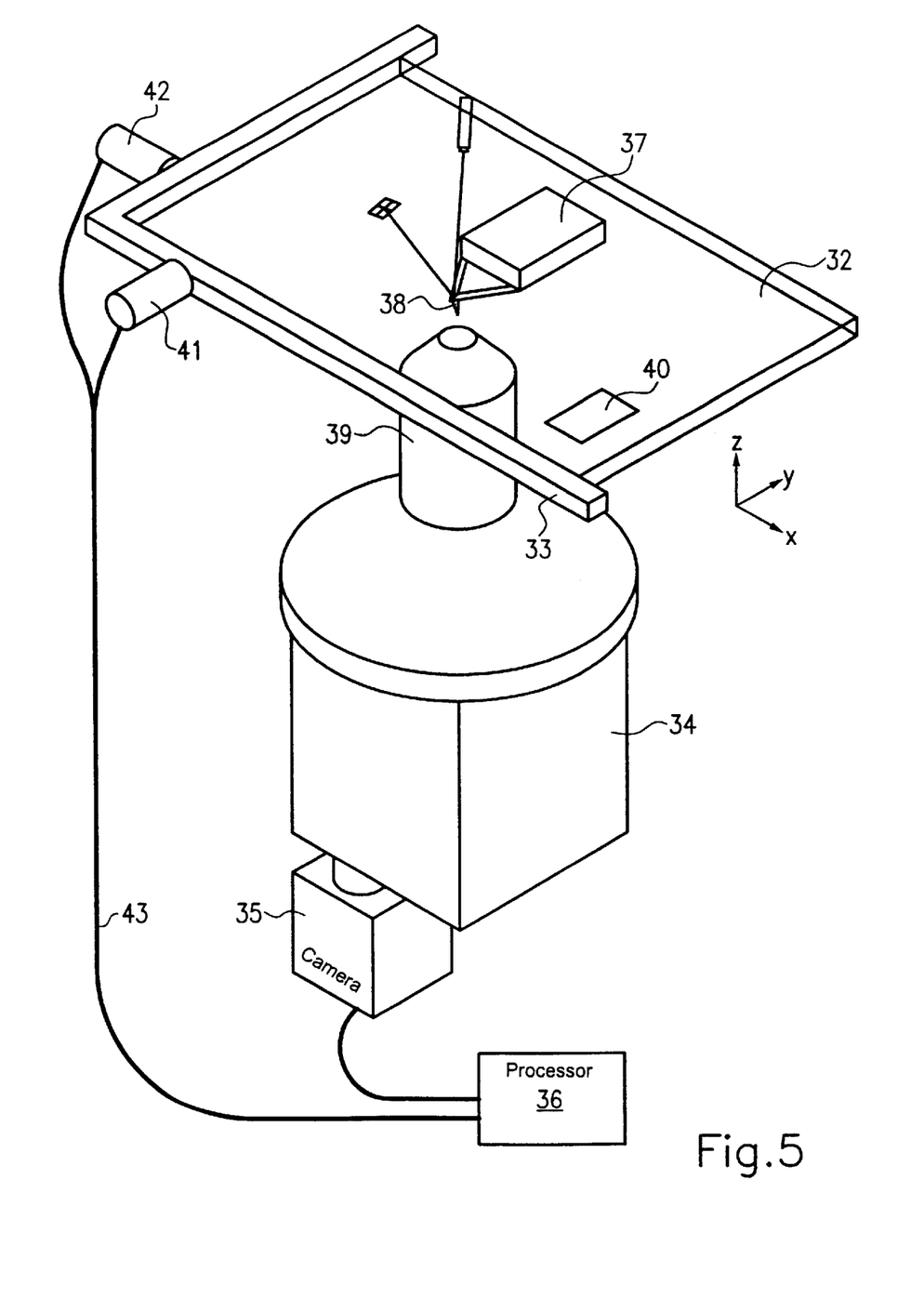
FIG. 5 is a diagrammatic, perspective view of the apparatus according to the invention for imaging and scanning photomasks.

FIG. 5 is to be used to illustrate the positioning principle according to the invention. To such an end, the finished photomask 32 is placed at a specific location on the mask table 33 that permits displacement of the mask in the x and y directions. The inverted microscope 34 images a specific detail of the photomask 32. The image evaluation can be performed either by an observer through an eyepiece, but the evaluation can also be carried out through a camera 35 and an image processing unit 36. In the image processing unit 36, the recorded mask structures can be compared with stored mask structures for assessing the quality of the photomask.

In a first step, the scanning instrument (a scanning force microscope 37 is shown in FIG. 5) and the optical microscope 34 are positioned relative to each other such that the scanning tip 38 of the scanning force microscope 37 can be detected in the field of view of the optical microscope 34. Such occurs when the objective 39 of the optical microscope 34 and the scanning tip 38 are located in mutually opposite positions. In the so-called "on-axis" position, the movement of the scanning tip 38 can be followed visually. To adjust the instruments initially in such a position, either the inverted optical microscope 34 or the scanning force microscope 37 is mounted such that it can be displaced in the x-y direction. The setting of the "on-axis" position is then carried out by threaded rods, setting screws, or other positioning elements. In the "on-axis" position, the two instruments are fixed relative to each other.

The setting of the mask details to be scanned and imaged can then be carried out exclusively by displacing the mask table 33. When the intention is to move to a new location on the photomask 32, for example, the control structure 40, then the scanning tip 38 and the objective 39 are also in the "on-axis" position in the new position of the mask table 33, so that the scanning tip 38 is visible in the microscope image without readjustment. Therefore, the scanning tip 38 can be positioned correctly at the new point by using visual indicators.

For the purpose of highly accurate positioning of the mask table 33, stepping motors 41 (for the x direction) and 42 (for the y direction) are provided. The selection of the mask position to be moved to can be made either manually or by a control program. As such, it is possible to move to an entire sequence of critical production mask structures or control structures 40 one after another and to check them. However, the control signals for driving the stepping motors 41, 42 can also be supplied by the image processing unit 36. The image processing unit 36 determines the actual position from the current microscope image by comparison with stored mask structures and, from the deviation between the actual position and desired position, and generates the necessary control signals, which are transmitted to the stepping motors 41 and 42 through the signal lines 43.

Figure 6:
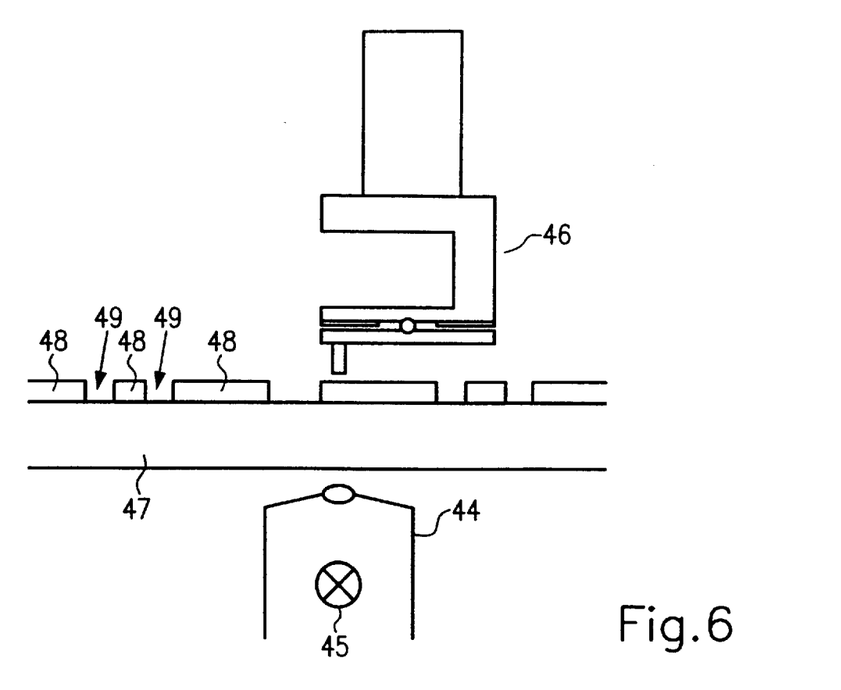
FIG. 6 is a diagrammatic, fragmentary, cross-sectional view of the apparatus according to FIG. 5 showing an illumination beam path in which the light source is disposed on a side of the optical microscope (incident light geometry)

The illumination of the mask can be carried out either from the side of the scanning instrument or from the side of the optical microscope. FIG. 6 shows an illumination beam path in which the photomask 47 is illuminated from the side of the optical microscope 44 rather than from the side of the, scanning instrument 46. For such a purpose, the light source 45 is integrated into the optical microscope 44 such that its light falls through the objective onto the photomask 47. The illuminating light is reflected back to the optical microscope 44 by the vapor-deposited structures 48, while no reflection takes place in the areas 49 with no vapor deposit. Therefore, the vapor-deposited structures 48 appear as light areas in the microscope image, while the areas 49 with no vapor deposit appear dark. If the probe of the scanning instrument 46 is located in an area 49 with no vapor deposit, then illuminating light passes through the photomask 47 to the probe, which then stands out as light against the dark background.

Regardless of the positioning method according to the invention, the illumination geometry is always advantageous when a mask is to be scanned and imaged. Use is made of the fact that the vapor-deposited structures reflect the illuminating light well, while the areas with no vapor deposit do not reflect the illuminating light. As a result, a contrasting image can be obtained. The advantage of such a configuration is that the light source does not hamper the scanning instrument. A further advantage is that the light source can be integrated into the optical microscope.

Figure 7:
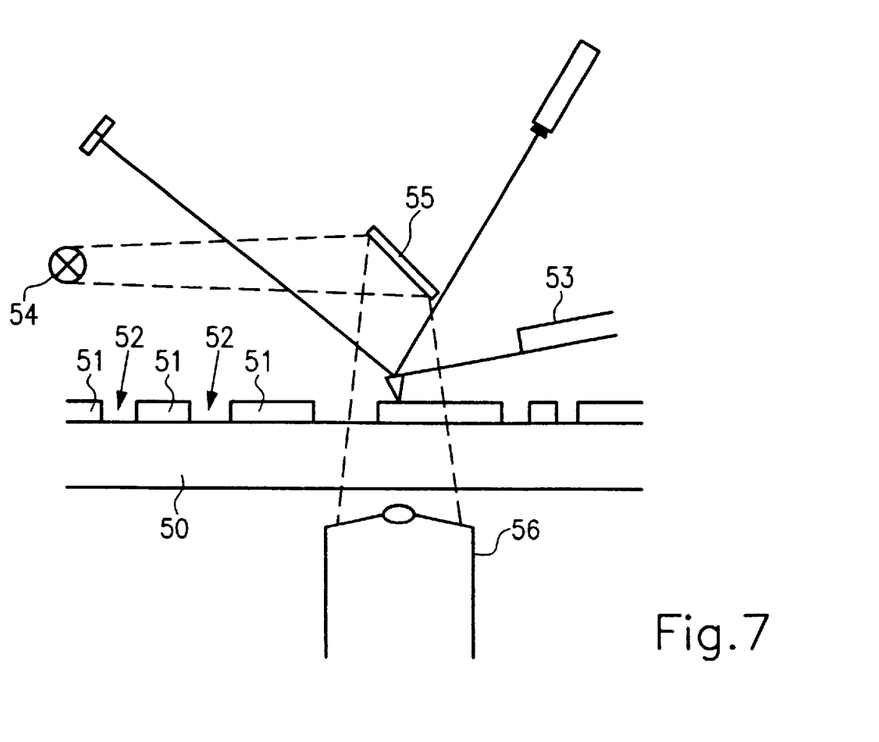
FIG. 7 is a diagrammatic, fragmentary, cross-sectional view of the apparatus according to FIG. 5 showing an illumination beam path in which the light source is fitted to the side of the scanning instrument (transmitted light geometry).

FIG. 7 illustrates an alternative illumination configuration, in which the illumination is carried out through the photomask 50 (transmitted light geometry). The surface of the photomask 50 has areas with vapor-deposited structures 51 and areas 52 with no vapor deposit. These structures are imaged from the underside by the inverted microscope 56. From the layer side, the scanning force microscope 53 scans them. The light source 54 is disposed on the side of the scanning force microscope 53 and illuminates the mask 50 through the mirror 55. The vapor-deposited structures 51 are opaque and therefore appear as dark areas in the microscope image. In the areas 52 with no vapor deposit, by contrast, the light from the illuminating source 54 passes unimpeded through the photomask 50 to the inverted microscope 56. Therefore, the areas 52 with no vapor deposit appear as light areas.

I claim:

1. An apparatus for imaging and scanning masks for semiconductor production, the masks having a layer side and an opposing side, the apparatus comprising:
   a scanning instrument having a probe, said probe disposed to scan a layer side of a mask;
   an optical microscope for imaging a detail of the mask from a side of the mask opposing the layer side, said optical microscope disposed opposite said scanning instrument with respect to the mask;
   a positioning device positioning said scanning instrument and said optical microscope relative to one another such that said optical microscope images said probe and the mask simultaneously; and
   a displacing device connected to the mask and laterally displacing the mask between and relative to said scanning instrument and said optical microscope to permit selection of an imaged detail of the mask while a relative position between said scanning instrument and said optical microscope is maintained.

2. The apparatus according to claim 1, wherein said displacing device is a displaceably mounted mask table.

3. The apparatus according to claim 2, including stepping motors connected to said mask table for positioning said mask table.

4. The apparatus according to claim 1, wherein said positioning device is a displaceable mounting of at least one of said scanning instrument and said optical microscope.

5. The apparatus according to claim 1, wherein said scanning instrument is a scanning probe microscope.

6. The apparatus according to claim 1, wherein said scanning instrument is a scanning force microscope.

7. The apparatus according to claim 1, wherein said scanning instrument is a scanning electron microscope.

8. The apparatus according to claim 1, wherein said scanning instrument is a surface profilometer.

9. The apparatus according to claim 1, including an illuminator for optical imaging of the mask, said illuminator being disposed on a side of the mask facing away from the layer side.

10. The apparatus according to claim 1, including an illuminator for optical imaging of the mask, said illuminator being disposed on the layer side of the mask.

11. The apparatus according to claim 10, wherein said illuminator has an illumination beam path, and at least one mirror is disposed in said illumination beam path.

12. The apparatus according to claim 1, wherein said optical microscope has a long working distance objective.

13. The apparatus according to claim 1, wherein said optical microscope is a phase contrast microscope and the mask is a phase mask.

14. The apparatus according to claim 1, including an image processing unit and a camera connected to said an image processing unit for supplying data thereto, said optical microscope being connected to said camera.

15. The apparatus according to claim 14, wherein said image processing unit has stored mask data and compares an imaged detail of the mask to said stored mask data.

16. The apparatus according to claim 14, wherein said image processing unit generates control signals for positioning the mask, is connected to said displacing device, and supplies said control signals to said displacing device for controlling displacement of the mask.

17. The apparatus according to claim 16, wherein said image processing unit supplies said control signals to said displacing device for controlling lateral displacement of the mask.

18. The apparatus according to claim 1, wherein:

the mask has control structures and critical production mask structures; and said displacing device is controlled to check at least one of the control structures and the critical production mask structures located on the mask.

19. An apparatus for imaging and scanning masks for semiconductor production, the masks having a layer side and an opposing side, the apparatus comprising:

a scanning instrument having a probe, said a probe disposed to scan a layer side of a mask;

an optical microscope for imaging a detail of the mask from a side of the mask opposing the layer side, said optical microscope disposed opposite said scanning instrument with respect to the mask;

means for positioning said scanning instrument and said opposing optical microscope relative to one another such that said optical microscope images said probe and the mask simultaneously; and means for laterally displacing the mask between and relative to said scanning instrument and said opposing optical microscope to permit selection of an imaged detail of the mask while a relative position between said scanning instrument and said optical microscope is maintained.

20. A method of imaging and scanning masks for-semiconductor production, which comprises:

placing a scanning instrument having a probe at a position to scan a layer side of a mask with the probe;

placing an optical microscope on a side of the mask opposite the layer side at a position to image a detail of the mask from the side of the mask opposite the layer side;

positioning the scanning instrument and the optical microscope relative to each other such that the optical microscope images the probe and the mask at the same time;

laterally displacing the mask while maintaining a relative position between the scanning instrument and the optical microscope; and at least one of imaging and scanning a selected detail of the mask.

21. The method according to claim 20, which further comprises laterally displacing the mask with a displaceably mounted mask table.

22. The method according to claim 21, which further comprises positioning the mask table with stepping motors.

23. The method according to claim 20, which further comprises positioning the scanning instrument and the optical microscope relative to one another with a displaceable mounting of at least one of the scanning instrument and the optical microscope.

24. The method according to claims 20, which further comprises illuminating the mask from the side of the mask opposite the layer side.

25. The method according to claim 20, which further comprises illuminating the mask from the layer side.

26. The method according to claim 25, which further comprises disposing a mirror in a beam path of the illumination.

27. The method according to claim 20, which further comprises checking at least one of control structures and critical production mask structures located on the mask by controlling lateral displacement of the mask.

* * * * *